United States Patent [19]
Morioka et al.

[11] Patent Number: 6,002,437
[45] Date of Patent: Dec. 14, 1999

[54] CAMERA HEAD HAVING A FLEXIBLE PRINTED CIRCUIT BOARD WITH THIN FOLDING PORTIONS ARRANGED IN A CYLINDRICAL HOUSING

[75] Inventors: Masanobu Morioka; Shinichi Kato, both of Tokyo, Japan

[73] Assignee: Sony Corporation, Tokyo, Japan

[21] Appl. No.: 08/893,063

[22] Filed: Jul. 15, 1997

[30] Foreign Application Priority Data

| Jul. 15, 1996 | [JP] | Japan | P08-185220 |
| Jul. 15, 1996 | [JP] | Japan | P08-185221 |
| Jul. 15, 1996 | [JP] | Japan | P08-185222 |
| Jul. 15, 1996 | [JP] | Japan | P08-185225 |

[51] Int. Cl.[6] .................................................. H04N 3/14
[52] U.S. Cl. ........................ 348/373; 348/375; 361/749; 439/67; 439/77
[58] Field of Search ........................ 348/373, 375, 348/376; 439/81, 82, 83, 67, 77; 361/749

[56] References Cited

U.S. PATENT DOCUMENTS

| 4,344,092 | 8/1982 | Miller ........................................ 348/373 |
| 5,233,426 | 8/1993 | Suzuki et al. ............................ 348/373 |
| 5,287,191 | 2/1994 | Suzuki et al. ............................ 348/375 |
| 5,583,571 | 12/1996 | Friedland ................................. 348/373 |
| 5,748,448 | 5/1998 | Hokari ..................................... 361/749 |

*Primary Examiner*—Wendy Garber
*Assistant Examiner*—Mitchell L. White
*Attorney, Agent, or Firm*—Jay H. Maioli

[57] ABSTRACT

A small-sized camera head having a connection device for a flexible printed circuit board to which connection pins of a small-sized round type connector can be soldered easily, and a small-sized multi-pin round connector permits easily performing a soldering operation for the connection pins. The round type connector connects a flexible printed circuit board to the round type connector having an even number of connection pins arranged symmetrically on parallel boundary lines of a band-shaped boundary area of a preset width passing through a center axis of a main body of the connector for dividing a connection surface into two equal portions and to plural connection pins arranged on the circumference of the circle centered about the center axis.

12 Claims, 10 Drawing Sheets

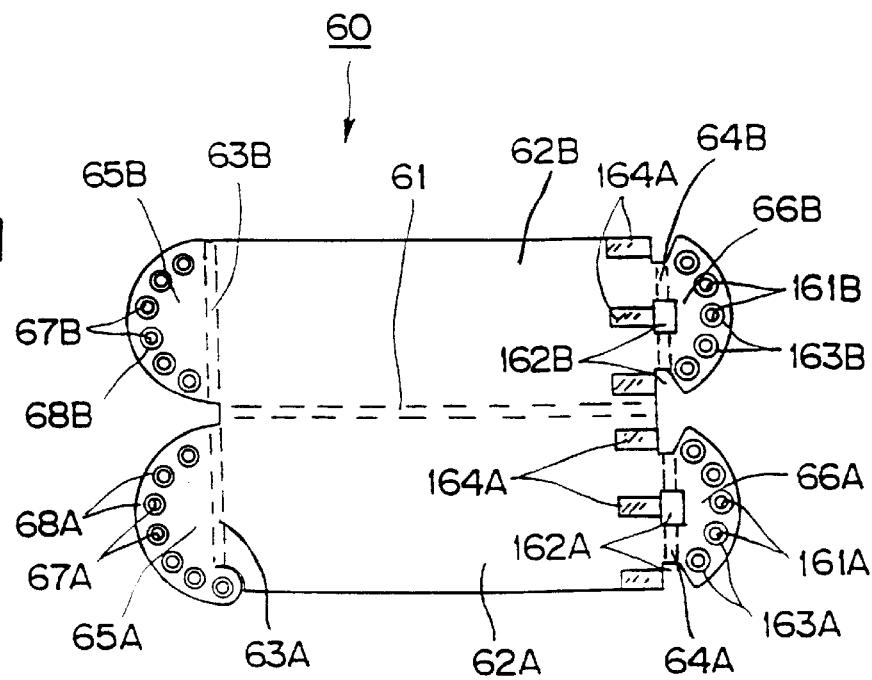
*FIG.8A*
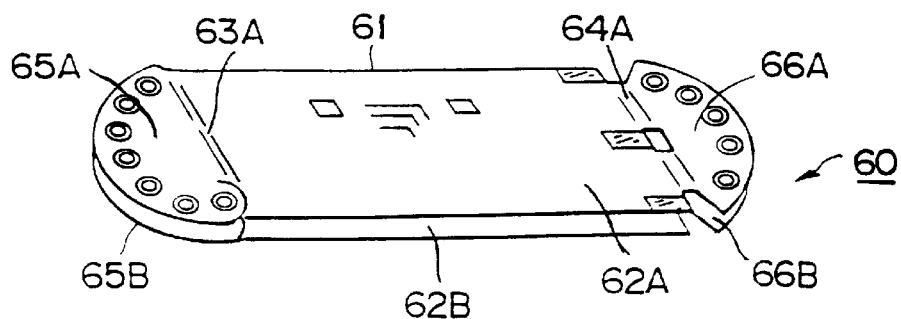
*FIG.8B*
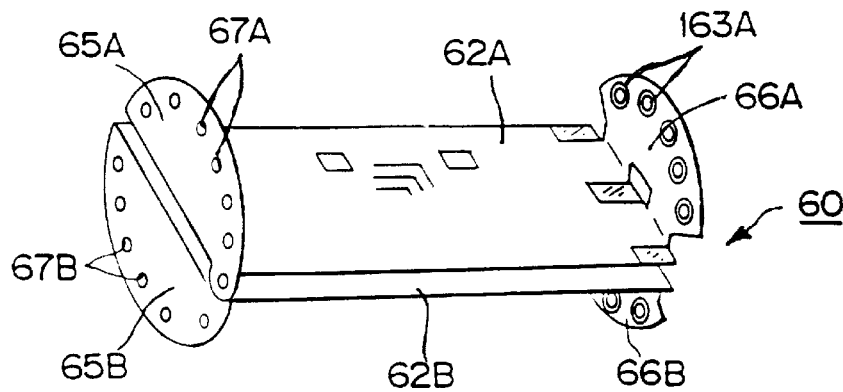
*FIG.8C*
FIG.8

CAMERA HEAD HAVING A FLEXIBLE PRINTED CIRCUIT BOARD WITH THIN FOLDING PORTIONS ARRANGED IN A CYLINDRICAL HOUSING

BACKGROUND OF THE INVENTION

1. Field of the Invention

This invention relates to a round type connector and a connection device for a flexible printed circuit board. The present invention is applicable to, for example, a small-sized electronic equipment such as a cylindrically-shaped small-sized camera head.

2. Description of the Related Art

In a conventional camera head, for example, a rigid circuit board, having mounted thereon a variety of circuit components, is multi-layered and enclosed in a casing. A flexible printed circuit board or a cable having both ends connected to connectors has been used for connection between an image sensor and the circuit board, or between the circuit board and an output connector.

The conventional camera head employing the above-described connection structure suffers from a problem that complicated operational steps are required in fabrication, thus raising the cost and lowering the reliability of the product while raising difficulties in reducing the size of the camera head.

In view of the above problems of the prior art, the present invention provides a flexible printed circuit board device, having a satisfactory space factor, which can be directly connected to an image sensor or to an output connector and which assures a mounting area for single-surface mounting comparable to that for a double-surface mounting.

For reducing the size of the camera head having such structure, it is necessary to reduce the size of the output connector.

In a connector, limitations are imposed on the interval between solderable connection pins, so that a problem is raised in the arrangement of the connection pins when reducing the connector size.

Thus the present invention provides a multi-pin round type connector which is small-sized and which permits a facilitated soldering operation for a connection pin.

The present invention also provides a connection device comprised of a flexible printed circuit board in which connection pins of a small-sized round type connector can be easily soldered to the circuit board.

In addition, an image sensor needs to be mounted so that its imaging surface will be perpendicular to the optical axis of the imaging optical system with the center of the imaging surface coincident with the optical axis of the optical axis.

In the conventional camera head, an optical disc holding mechanism of a complex structure for holding the image sensor in position to a high accuracy is required, thus impeding reduction in size of the device and lowering the operational reliability.

Thus the present invention provides a holding device for an image sensor of a simplified structure whereby the image sensor can be mounted and held in position with a high accuracy.

BRIEF DESCRIPTION OF THE DRAWINGS

FIGS. 8A–8C are perspective views of the assembled state of the flexible printed circuit board.

DESCRIPTION OF THE PREFERRED EMBODIMENTS

Figure 1:
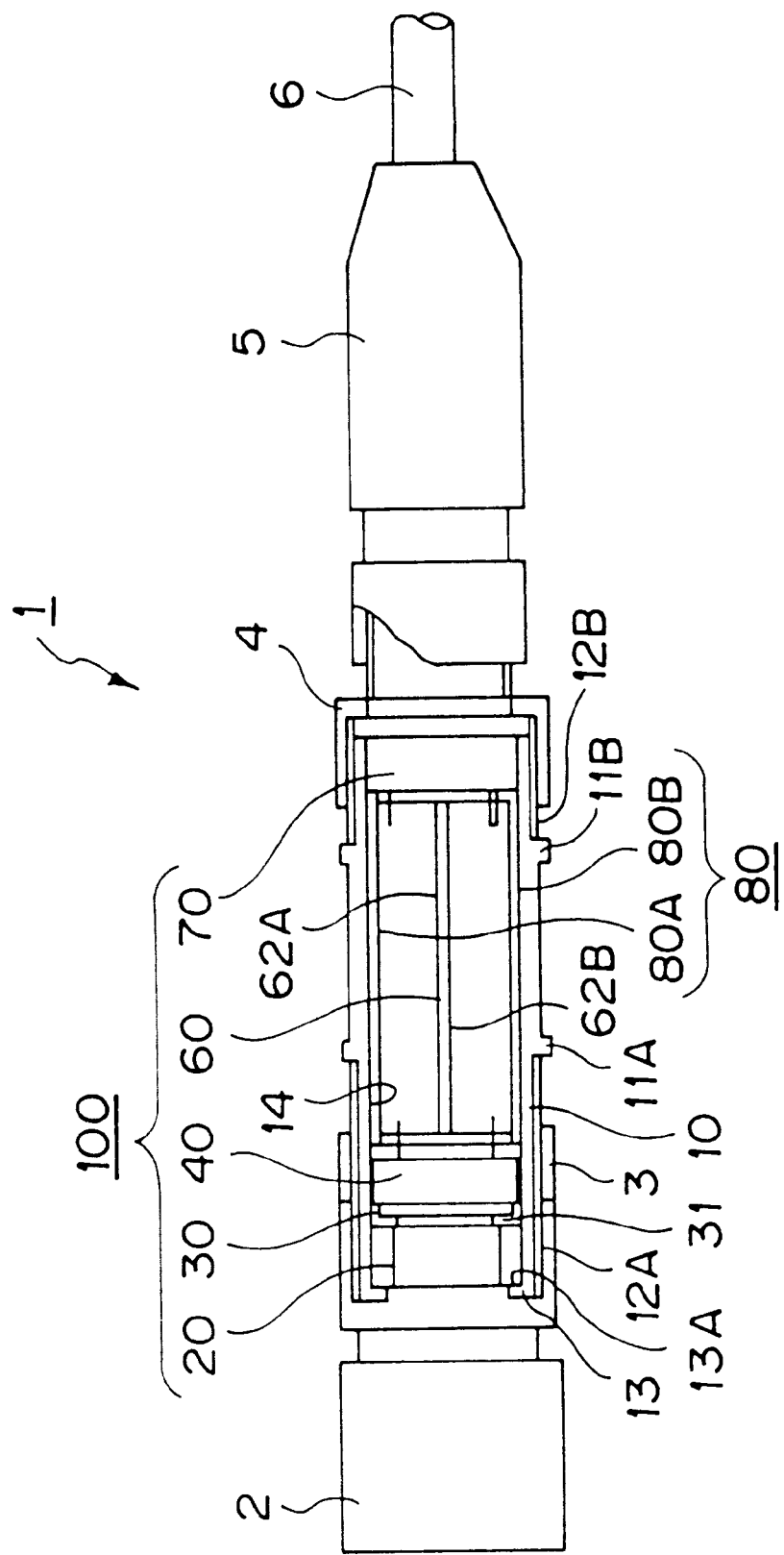
FIG. 1 is a schematic longitudinal cross-sectional side view of a camera head according to the present invention.

Referring to the drawings, preferred embodiments of the present invention will be explained in detail.

A round type connector and a connection device for a flexible printed circuit board, according to the present invention, are applied to a camera head 1 configured as shown for example in FIGS. 1 to 13.

This camera head is a cylindrically-shaped small-sized camera head having the size of a small finger. Referring to FIG. 1, showing its schematic longitudinal cross-section, the camera head 1 includes a cylindrically-shaped outer casing 10 within which are housed an optical filter 20, a packing 30, a CCD image sensor 40, a back plate 50, a flexible printed circuit board 60 and a round type connector 70 together making up a main body of the camera head 100. The main body of the camera head 100 is housed within the outer casing 10 with the flexible printed circuit board 60 being sheathed in a cylindrically-shaped inner casing 80.

On the outer rim of the outer casing 10 are formed flanges 11A, 11B for position regulation for mounting the outer casing on a holder 200 as later explained. Towards both ends along the center axis of the outer casing 1 are formed female threaded portions 12A, 12B. On the camera head 1, a lens barrel 2, carrying a photographing lens, not shown, is removably mounted on the forward side female threaded portions 12A along the center axis of the outer casing 10. The lens barrel 2 is secured in position by a lock nut 3. On the camera head 1 is secured the round type connector 70 by a flange nut 4 being threadedly attached to the rear female threaded portion 12B along the center axis of the outer casing 10, as will be explained subsequently. A cable connector 5 is mounted on the round type connector 70 for connecting the camera head 1 via a cable 6 to a camera control unit, not shown.

The outer casing 10 is formed as a cylinder having an inner diameter substantially equal to the outer diameter of the cylindrically-shaped inner casing 80. On the forward end portion along the center axis of the inner rim of the outer casing 10 is formed an inwardly facing flange 13. In a columnar-shaped housing section 14 formed by the inner surface of the outer casing 10 is housed the main body of the camera head 100 having its flexible printed circuit board 60 sheathed by the inner casing 80.

Figure 2:
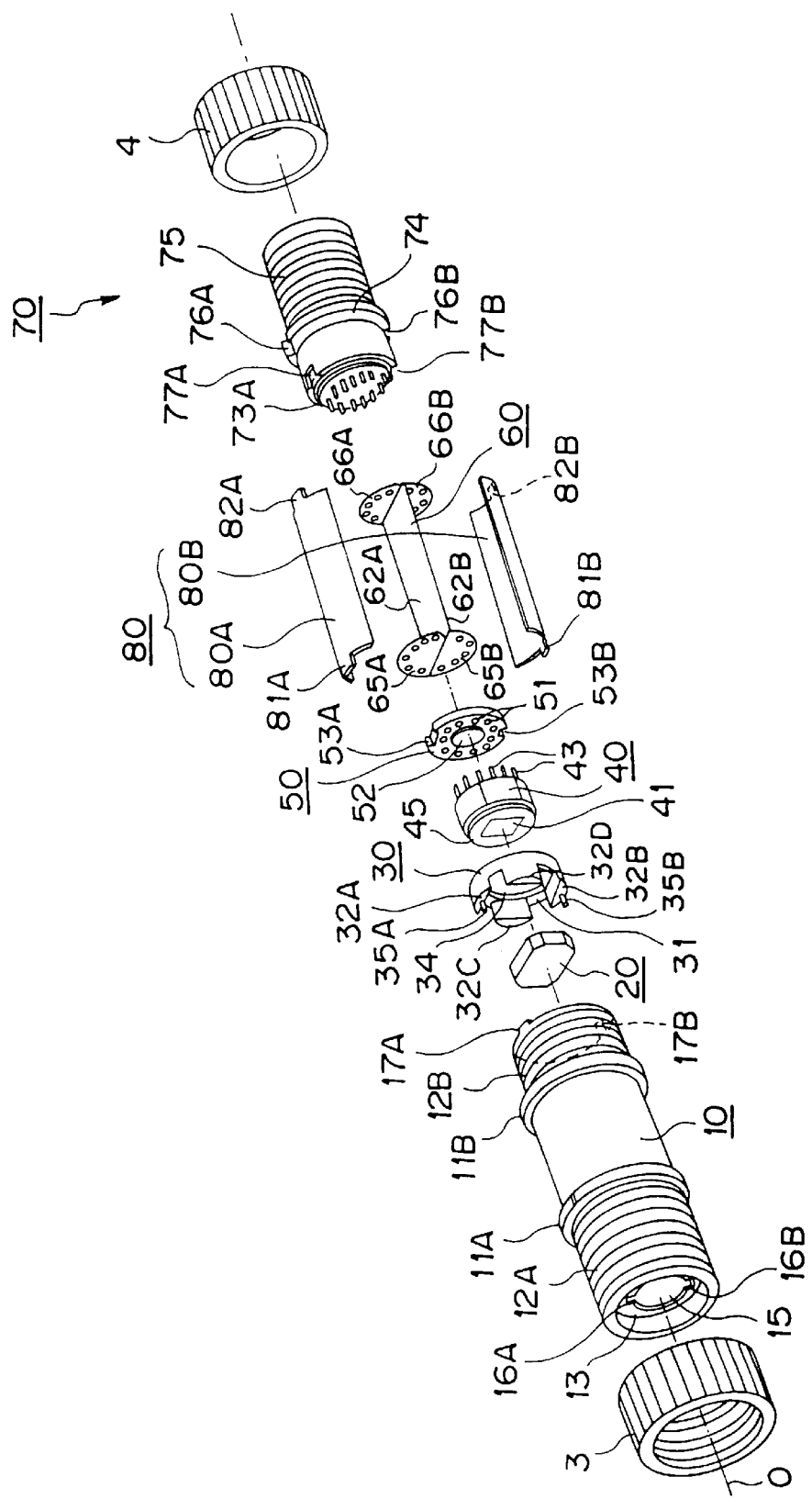
FIG. 2 is an exploded perspective view of the camera head shown in FIG. 1.
Figure 3:
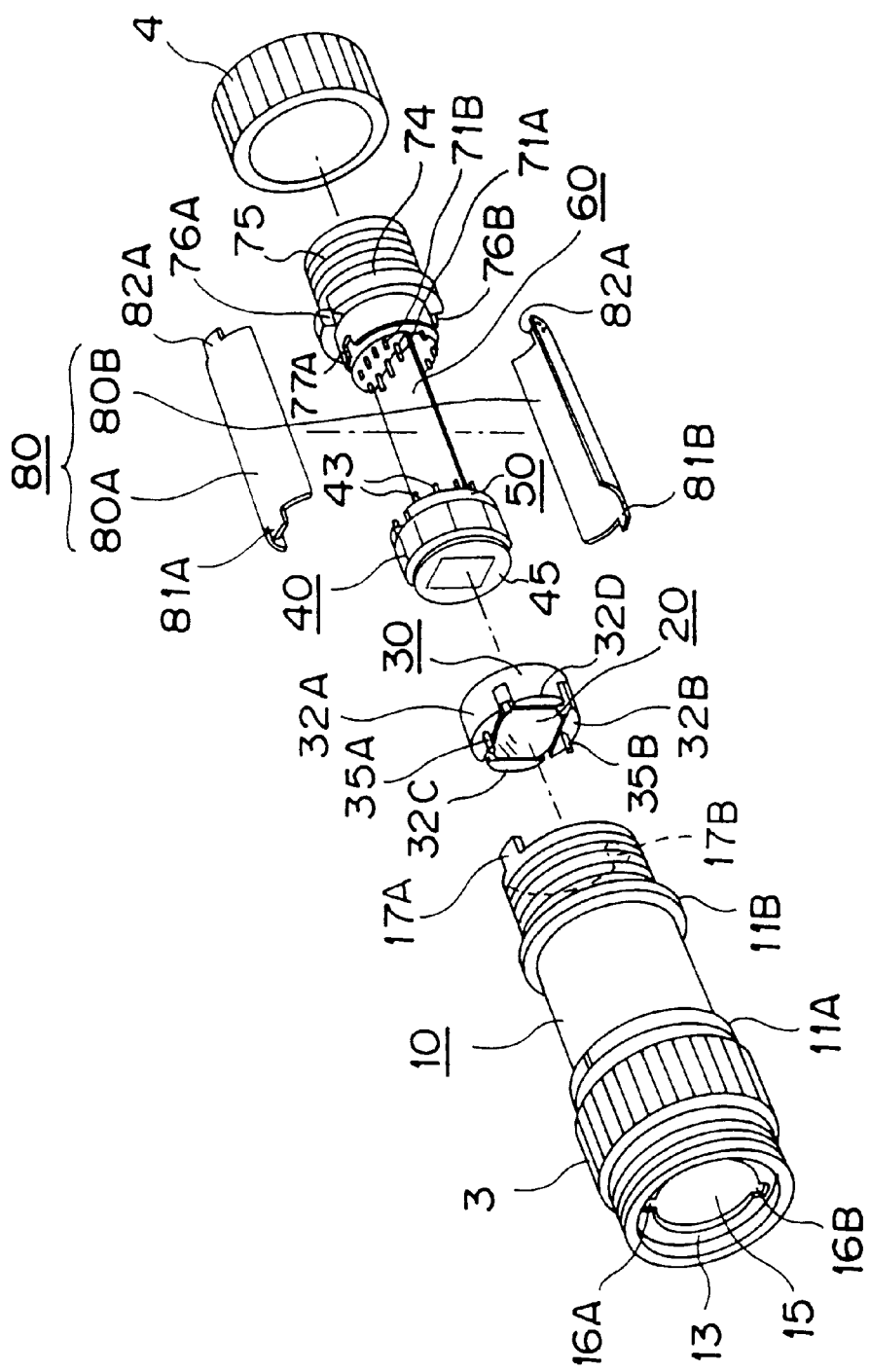
FIG. 3 is an exploded perspective view of the camera head in which an image sensor and a round type connector of the present invention are interconnected via a flexible printed circuit board.

The inwardly facing flange 13 is used for position regulation of the forward end along the optical axis of the main body of the camera head 100 housed within the housing section 14, and is formed as a ring having a central light path opening 15 sized to encompass the imaging range of the image sensor 40. This in turned flange 13 has cut-outs 16A, 16B for position regulation as to rotation about the axis at an upper position and at a lower position in the up-and-down direction extending perpendicular to the optical axis, as shown in FIG. 3. Two protrusions 17A, 17B for rotation about the optical axis are formed at an upper position and at a lower position in the up-and-down direction perpendicular to the optical axis extending towards the rear end as shown in FIGS. 2 and 3.

Although the two protrusions 17A, 17B may be of the same shape, these are of different size in the present embodiment. By providing the protrusions 17A, 17B of different size, the relative position of the main body of the camera head 100 with respect to the up-and-down direction in the normal mounting state of the main body of the camera head 100 can be checked easily.

Meanwhile, the up-and-down direction perpendicular to the optical axis means the vertical direction in the normal mounting state of the main body of the camera head 100. The optical axis of the main body of the camera head 100 coincides with the center axis of the outer casing 10.

The optical filter 20 is formed as a rectangle having a substantially rectangular light incident surface and a substantially rectangular light outgoing surface corresponding to the imaging surface of the image sensor 40 with an aspect ratio of 3:4 (with a diagonal line of 5) of the image sensor 40.

The packing 30 is made up of a ring portion 31 having an outer diameter slightly smaller than the inner diameter of the outer casing 10 and four arm sections 32A, 32B, 32C and 32D set upright at four places, namely at an upper portion, a lower portion, a left-end portion and a right-end portion of the ring portion 31. The ring portion 31 has a center optical path opening 34 which is sized to encompass the imaging range by the image sensor 40. The arm sections 32A, 32B formed upright on the upper and lower positions of the ring portion 31 are formed with projections 35A, 35B corresponding in shape to the cut-outs 16A, 16B formed in the inwardly facing flange 13 of the outer casing 10. The packing 30 is molded from, for example, silicon rubber.

With the packing 30 loaded on the optical filter 20, the state of the optical filter 20 is such that, as shown in FIGS. 1 and 3, the ring portion 31 of the packing 30 is abutted against the outer periphery of the outgoing surface of the optical filter 20, with the four lateral sides thereof being gripped by the four arm sections 32A, 32B, 32C and 32D of the ring portion 31 of the packing 30. The packing 30 operates as a holding member for holding the optical filter 20 at a preset position relative to the outer casing.

The optical filter 20 is inserted into the housing section 14 of the outer casing 10, with the packing 30 mounted thereon, as shown in FIG. 1, and is position-controlled to a condition of being perpendicular to the optical axis by the outer rim portion of the light incident surface being abutted against the position regulating surface 13A of the inwardly facing flange 13. The projections 35A, 35B provided on the arm sections 32A, 32B of the packing 30 are engaged in the cut-outs 16A, 16B of the inwardly facing flange 13 of the outer casing 10 for position regulation in the direction of rotation about the optical axis whereby the packing 30 is mounted at a preset angular position.

Although not shown, the outer peripheral surfaces of the arm sections 32A, 32B, 32C and 32D are formed with ribs of a height for abutting against the inner peripheral surface of the outer casing 10 for positively holding the optical filter 20 in the outer casing 10 by the arm sections 32A, 32B, 32C and 32D.

Figure 4:
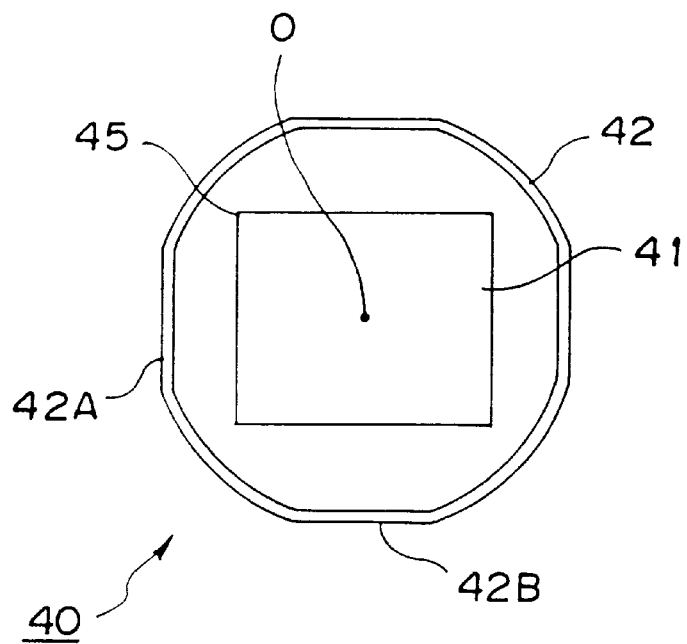
FIG. 4 is a front view of the image sensor.
Figure 5:
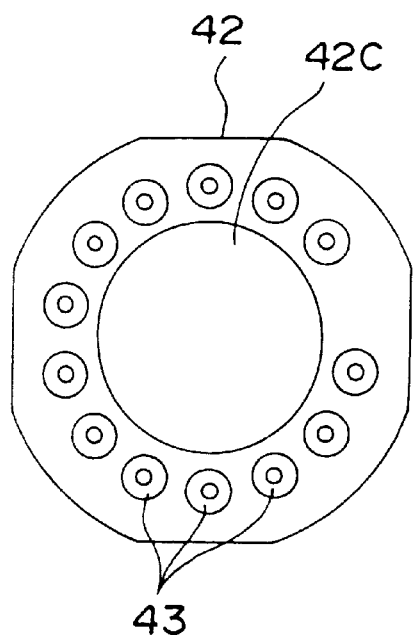
FIG. 5 is a back side view of the image sensor.

The image sensor 40 has an imaging surface 41 with an aspect ratio of 3:4, with a diagonal line equal to 5, as shown in FIGS. 4 and 5, with two mutually perpendicular sides 42A, 42B and a back surface 42C of a ceramic casing 42 operating as reference planes for the center of the effective imaging area, that is the optical axis O. In the present image sensor 40, thirteen electrical connection lines 43 are derived from the back surface 42C of the ceramic casing 42 at thirteen equiangular positions centered about the is O, as shown in FIG. 5.

Figure 6:
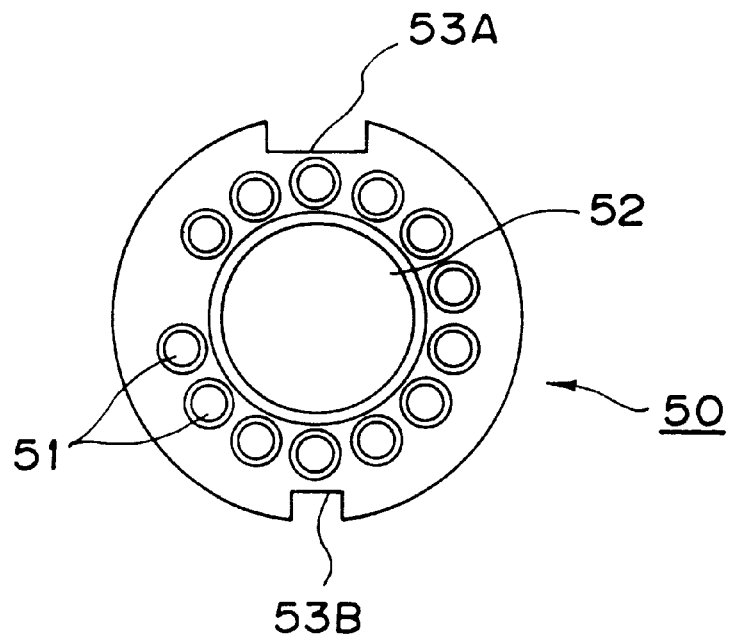
FIG. 6 is a front view of a back plate connected to a back side of the image sensor.
Figure 7:
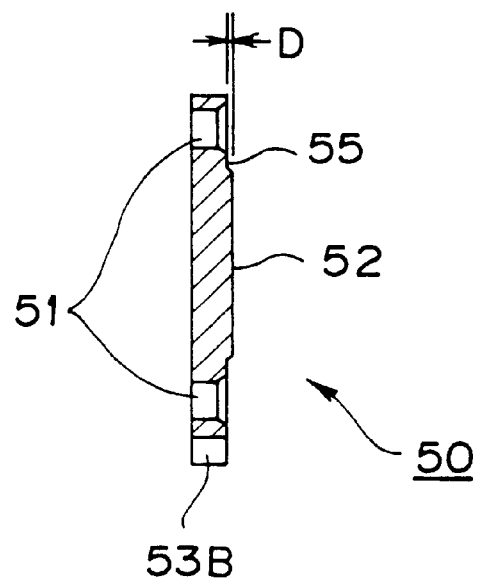
FIG. 7 is a longitudinal cross-sectional side view of the back plate.

The back plate 50 is formed as a disc having an outer diameter substantially equal to the inner diameter of the outer casing 10, and has thirteen small holes 51 passed through by the thirteen electrical connection lines 43 of the image sensor 40, as shown in FIG. 6. These small holes 51 are in the shape of a funnel having a conically shaped surface flared towards the inserting side to permit facilitated insertion of the lead lines 48. The center portion of the surface of the back plate 50 surrounded by the thirteen small holes 51 of the back plate 50 is raised slightly beyond the rim portion from the back surface 42C facing the ceramic casing 42C. This raised center portion is used as an adhesive surface 52 with respect to the back surface 42C of the ceramic casing 42. The upper and lower portions of the outer rim of the back plate 50 are formed with cut-outs 53A, 53B for regulating the position in the direction of rotation about its axis.

Although the two cut-outs 53A, 53B may be of the same shape, these are of different size in the present embodiment. By providing the cut-outs 53A, 53B of different size, the relative position of the main body of the camera head 100 with respect to the up-and-down direction in the normal mounting state of the image sensor 40 can be checked easily.

The back plate 50 is molded of synthetic resin. Resin molding leads unavoidably to generation of burrs due to the presence of an extruder pin. Thus, if the facing surface of the back plate 50 is formed as a planar surface in its entirety, the back plate 50 cannot be maintained planar due to burrs. Thus, by providing a step difference D between the center portion and the peripheral portion of the facing surface of the back plate 42C of the ceramic casing 42, and by carrying out the molding so that burrs 55 due to the extruder pin will be generated in the peripheral portion, the planar adhesive surface 52 may be produced in the protruded center portion.

With the thirteen electrical connection lead lines 43 inserted through the thirteen small holes 51 in the back plate 50 for assuring position matching with the reference surfaces, that is the lateral sides 42A, 42B of the ceramic casing 42, the adhesive surface 52 of the back plate 52 is bonded to the back surface 42C of the ceramic casing 42 operating as a reference surface. The thirteen electrical connection lines 43 of the image sensor are passed through the thirteen small holes 51 of the image sensor 40 and thereby maintained with a pre-set distance between adjoining lead lines 43.

The flexible printed circuit board 60 includes first and second rectangular chip component mounting portions 62A, 62B folded in a U-shape with a mounting surface for electric parts, such as chip components, facing outwards. On the chip component mounting portions 62A, 62B are mounted chip components making up a driving circuit for the image sensor 40 or the pre-amplifiers. The electrical connection lines 43 of the image sensor 40 are connected to the first and third soldering portion 65A, 65B, while connecting pins 71A, 71b of the round type connector 70 are connected to second and fourth soldering portions 66A, 66B.

Referring to a developed plan view of FIG. 8A, the flexible printed circuit board 60 has rectangular first and second chip component mounting portions 62A, 62B, each being a thick film layer, connected to each other by a first folding portion 61 formed by a thin film layer, and substantially semi-circular first and second soldering portions 65A, 66A, each being a thick film layer, connected to short side portions of the first chip component mounting portion 62A by second and third folding portions 63A, 64A, each being a thin film layer. The flexible printed circuit board 60 also has third and fourth soldering portions 65B, 66B, each being a thick film layer, connected to short side portions of the second chip component mounting portion 62B via fourth and fifth folding portions 63B, 64B each being a thin film layer. On the first and second chip component mounting portions 62A, 62B are mounted chip components making up a driving circuit for the image sensor 40 or the pre-amplifier.

The flexible printed circuit board 60 is bent in the U-shape at the first folding portion 61 with the chip component mounting surface directed to outside, as shown in FIG. 8B, and is further bent at the second to fifth folding portions 63A, 64A, 63B, 64B as shown in FIG. 8C, so that the first to fourth soldering portions 65A, 66A, 65B, 66B are opened substantially at 90°.

The first soldering portion 65A has 7 through-holes 67A passed through by the electrical connection lines 43 of the image sensor 40, while the third soldering portion 65B has 6 through-holes 67B passed through by the lead lines 43 of the image sensor 40. On the component mounting surface of the flexible printed circuit board 60 are mounted connection land portions 68A, 68B of the lead line 43 of the image sensor 40 for surrounding the through-holes 67A, 67B of the first and third soldering portions 65A, 65B.

In the second and fourth soldering portions 66A, 66B are formed 5 through-holes 161A, 161B passed through by connection pins 71A arranged on the circumference of the round type connector 70 as later explained, and three through-holes 162A, 162B passed through by connection pins 71B mounted on boundary lines of the round type connector 70, also as later explained. On the component mounting surface of the flexible printed circuit board 60 are mounted the connection lands 163A, 163B of the connection pins 71A of the round type connector 70 for surrounding the through-holes 161A, 161B of the second and fourth soldering portions 66A, 66B. On the component mounting surfaces of the flexible printed circuit board 60 are mounted connection lands 164A, 164B of the connection pins 71B of the round-type connector 70 in the portions of the second and fourth soldering portions 66A, 66B of the first and second chip component mounting portions 62A, 62B neighboring to the through-holes 162A, 162B of the second and fourth soldering portions 66A, 66B.

In the above-described flexible printed circuit board 60, since the chip components are mounted only on one surface, the mounting operation may be carried out with high workability. Since the circuit board is folded in a U-shape with the chip mounting surface directed the outside, the mounting area similar to that achieved with double side mounting can be achieved, while the occupied space may be diminished.

Figure 9:
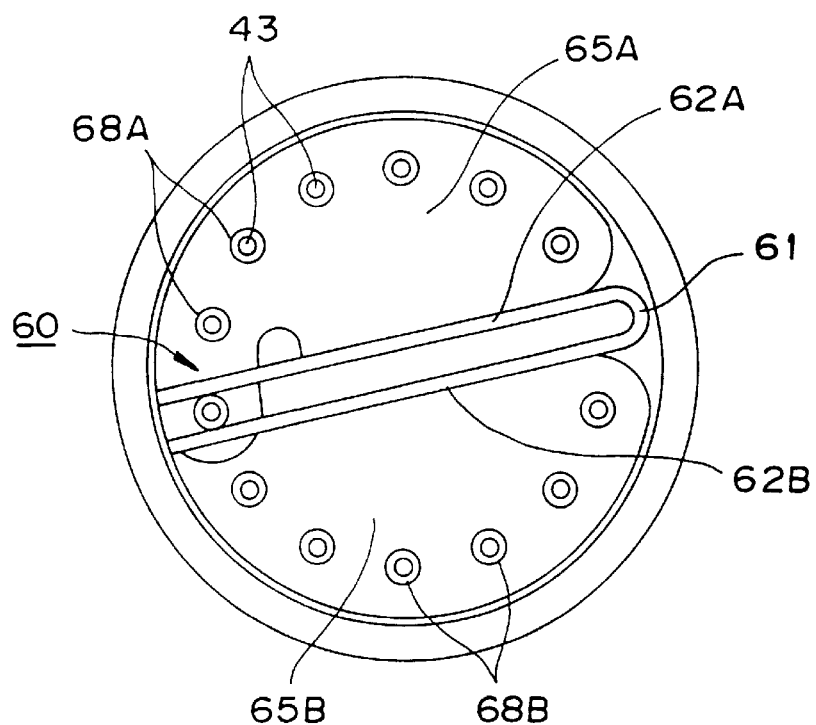
FIG. 9 is a back view showing the state of interconnection between a connection lead wire of the image sensor and the flexible printed circuit board.

In the first and third soldering portions 65A, 65B in the flexible printed circuit board 60, the thirteen electrical connection lines 43 of the image sensor 40 are passed through the first and third soldering portions 65A and 65B, as shown in FIG. 9, so as to be soldered to the connection lands 68A, 68B.

Figure 10:
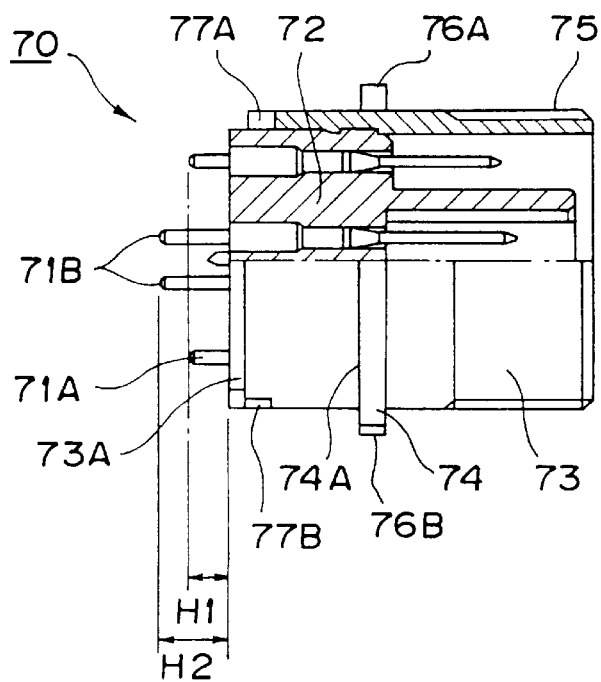
FIG. 10 is a partial longitudinal cross-sectional side view of the round type connector.
Figure 11:
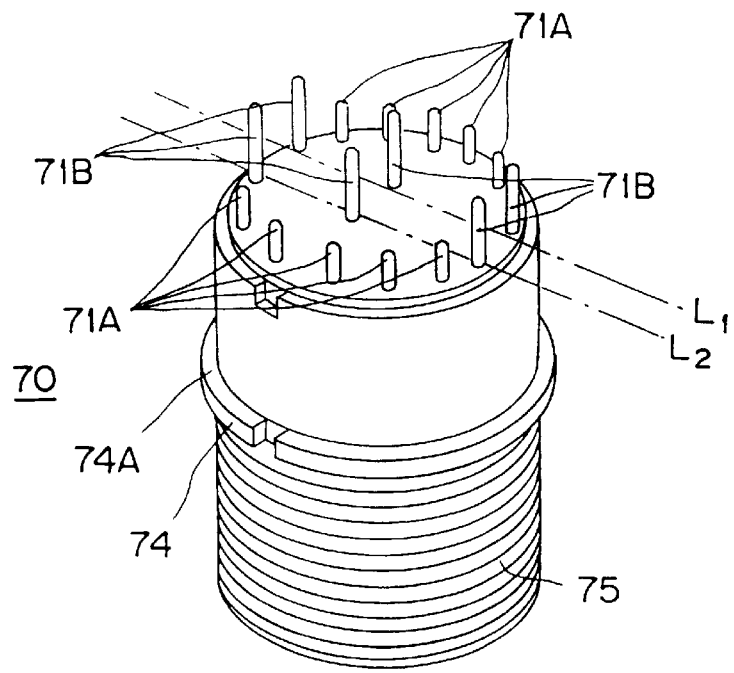
FIG. 11 is a perspective view showing the mounted state of the connection pin of the round type connector.

The round-type connector 70 has a columnar-shaped insulator 72, having connection pins 71A, 71B pressed therethrough at pre-set positions, and a cylindrically-shaped shell 73 to which is fitted this insulator 72, as shown in a schematic cross-sectional view of FIG. 10.

The shell 73 of the round type connector 70 is formed of an electrically conductive metal, such as brass, to a cylindrical shape of substantially the same outer diameter as the inner diameter of the outer casing 10. On the outer periphery of the shell 73 are formed an flange 74 for position regulation of the outer casing during its mounting and a threaded portion 75 on the rear side along it axis. On the round type connector 70 is detachably mounted the cable connector 5 via the threaded portion 75.

The outturned flange 74 formed on the outer periphery of the shell 73 takes charge of position regulation at the rear end along the optical axis of the main body of the camera head 100 housed in the housing section 14 of the outer casing 10, and includes a position regulating surface 74A forming a planar surface extending at right angles to the optical axis. The outturned flange 74 has position-regulating cut-outs 76A, 76B at two positions, namely at upper and lower positions in the up-and-down direction extending at right angles with the axial direction, for regulating the rotation about the axis. The cut-outs 76A, 76B are shaped to meet with the position-regulating protrusions 76A, 76B provided at the rear end along the optical axis of the outer casing 10.

The shell 73 also has a position regulating surface 73A forming a plane extending at right angles to the optical axis, at the forward end in the axial direction, while having cut-outs 77A, 77B for regulating the position in the direction of rotation about the axis at two positions, namely an upper position and at a lower position in the up-and-down direction extending at right angles to the optical axis. The cut-outs 77A, 77B are of the same shape as the cut-outs 53A, 53B formed in the back plate 50.

The 70 is a round type connector according to the present invention is a 16-pin connector having six connection pins 71B and ten connection pins 71A. The connection pins 71B are arrayed symmetrically on two parallel boundary lines L1, L2 of a band-shaped boundary area of a preset width passing through the center axis of a main connector body for dividing the surface of the main connector body extending at right angles to the center axis of the main connector body into two equal portions. The connector pins 71A are arrayed on the circumference centered about the center axis and in areas other than the boundary area. The six connection pins 71B arranged symmetrically on the boundary lines are protruded in an amount H2 which is larger than an amount of protrusion H1 of the ten circumferential connection pins 71A.

Figure 12:
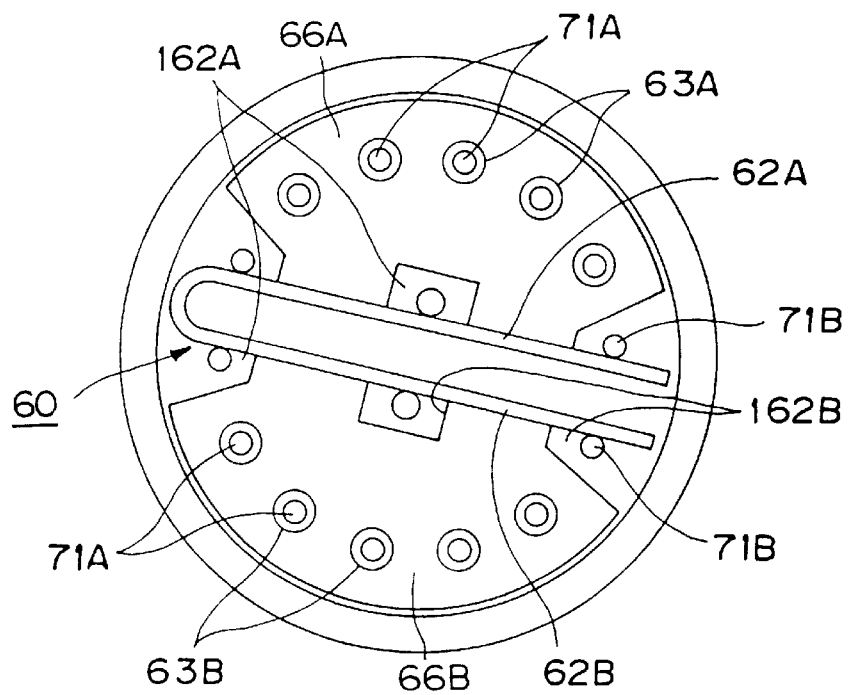
FIG. 12 is a front view showing the state of connection between the connection pin of the round type connector and the flexible printed circuit board.
Figure 13:
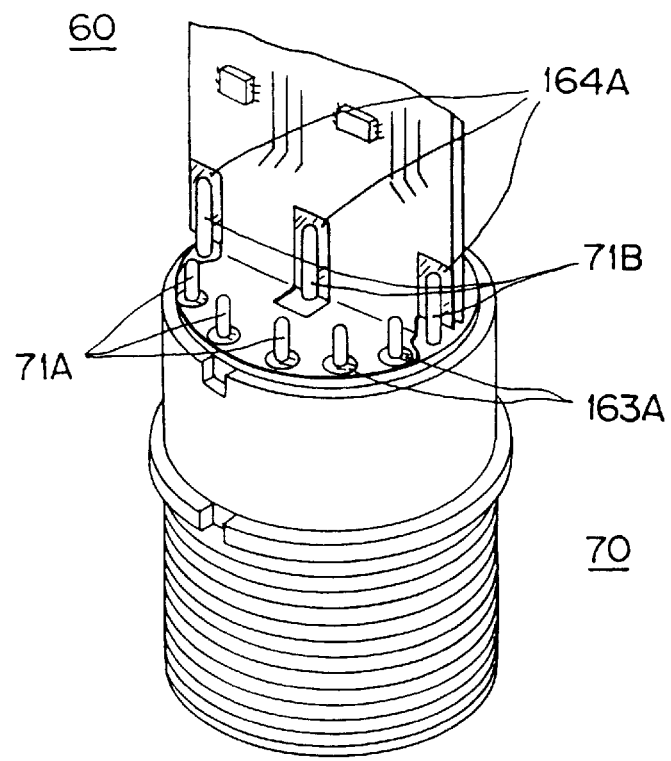
FIG. 13 is a perspective view showing the state of connection between the connection pin of the round type connector and the flexible printed circuit board.

In the above-described round type connector 70, the connection pins 71A, 71B are passed through the through-holes 161A, 161B, 162A, 162B of the second and fourth soldering portions 66A, 66B of the flexible printed circuit board 60 so as to be soldered to the connection lands 163A, 163B, 164A and 164B, as shown in FIGS. 12 and 13.

In this manner, the connection pins 71A, 71B of the round type connector 70 are passed through the 161A, 161B, 162A, 162B of the second and fourth soldering portions 66A, 66B of the flexible printed circuit board 60 so as to be soldered to the connection lands 163A, 163B, 164A and 164B for completing a connection device for a flexible printed circuit board according to the present invention.

In this round type connector 70, the circumferentially arranged connection pins 71A can be soldered from outside, and hence can be reliably soldered to the connection lands 163A, 163B even if the connection pins are of a narrow pitch. On the other hand, since the connection lands 164A, 164B of the first and second chip component mounting portions 62A, 62B, to which are soldered the six connection pins 71B arrayed symmetrically on the boundary lines, may be larger in size than the connection lands 163A, 163B to which are soldered the circumferentially arrayed connection pins 71A, the connection pins 71B can be soldered easily. By increasing the area of the connection lands 164A, 164B, it becomes possible to cause a larger current to flow via the connection pins 71B. Moreover, if, after the six connection pins 71B arrayed symmetrically on the boundary lines are soldered to the connection lands 164A, 164B for provisionally securing the flexible printed circuit board 60, the circumferentially arrayed connection pins 71A are soldered to the connection lands 163A, 163B, the connection pins 71A can be soldered easily for improving workability and operating reliability of the soldering operation. Furthermore, by selecting the protruding amount H2 of the six connection pins 71B arrayed symmetrically on the boundary lines to be larger than the amount of protrusion H2 of the six connection pins 71B, it becomes possible to improve the workability of the soldering operation of the connection pins 71B.

The inner casing 80 is made up of two semi-cylindrically-shaped inner casing halves 80A, 80B split in a plane including the above-mentioned center axis. This inner casing 80, formed of, for example, stainless steel, is of a length corresponding to the length of the flexible printed circuit board 60.

The inner casing halves 80A, 80B, making up the inner casing 80, are formed at end faces thereof with lugs 81A, 81B, 82A, 82B for position-matching in the rotational direction about the center axis of the inner casing 80, as shown in an exploded perspective view of FIG. 3.

The lugs 81A, 82A provided on the inner casing half 80A are shaped for mating with the cut-outs 53A and 77A provided in the shell 73 of the round-type connector 70 and in the back plate 50, respectively.

By abutting the inner casing halves 80A, 80B of the inner casing 80 for encircling the flexible printed circuit board 60, with the lugs 81A, 81B engaging in the cut-outs 53A, 53B formed in the back plate 50, respectively, and with the lugs 82A, 82B engaging in the cut-outs 77A, 77B formed in the shell 73 of the round-type connector 70, respectively, the inner casing 80 operates as a connecting tube for mechanically interconnecting the image sensor 40 bonded to the back plate 50 and the round-type connector 70 together.

In the provisionally secured state of the main body of the camera head 100, with the face plate 45 of the image sensor 40 being fitted with the ring 31 of the packing 30, the main body of the camera head 100 is housed in the housing section 14 of the outer casing 10, and a flange nut 4 is threaded to a rear threaded portion 12B in a direction along the center axis of the outer casing 10. This leads to fixed mounting of the main body of the camera head 100 under the following position-regulated state:

That is, if the flange nut 4 is threaded to the rear threaded portion 12B in the direction along the center axis of the outer casing 10, the main body of the camera head 100 is thrust forwards along the center axis of the outer casing 10 along with the round-type connector 70, as the flange nut 4 is progressively screwed.

This causes the outer rim of the incident surface of the optical filter 20, disposed at the leading end in the direction of the optical axis of the main body of the camera head 100, to be abutted against the position regulating surface 13A of the inwardly facing flange 13, thus position-regulating the optical filter 20 so as to be perpendicular to the optical axis. Simultaneously, the projections 35A, 35B formed on the arm sections 32A, 32B of the packing 30 are engaged in the cut-outs 16A, 16B formed in the inwardly facing flange 13 of the outer casing 10 for position-regulating the optical filter in the rotational direction about the optical axis, thus holding the optical filter in the pre-set mounting position to a high accuracy.

By such forward thrusting, the position regulating surface 73A formed at the distal end in the center axis direction of the shell 73 of the round type connector 70 is abutted against the one end face of the inner casing 30, with the back plate 50 bonded to the back surface 42C as the reference plane of the ceramic casing 42 of the image sensor 40 being abutted against the other end face of the inner casing 80. This thrusts the imaging surface of the image sensor 40 against the radiating surface of the optical filter 20 via packing 30, by way of position regulation, with the reference back surface 42C of the ceramic casing 42 of the image sensor 40 remaining positively parallel to the position regulating surface 73A provided in the shell 73.

In addition, the position regulating surface 74A formed on the flange 74 of the shell 73 is abutted against the position regulating surface 17 of the outer casing 10. This assures parallelism between the position regulating surface 74A formed on the flange 74 of the shell 73 and the position regulating surface 13A formed on the inwardly facing flange 13 of the outer casing 10.

In abutting the position regulating surfaces together, the position regulation in the direction of rotation about the axis by relative engagement between the lugs and the cut-outs is realized, thus enabling the optical filter 20 to be positioned with high accuracy relative to the image sensor 40.

Figure 14:
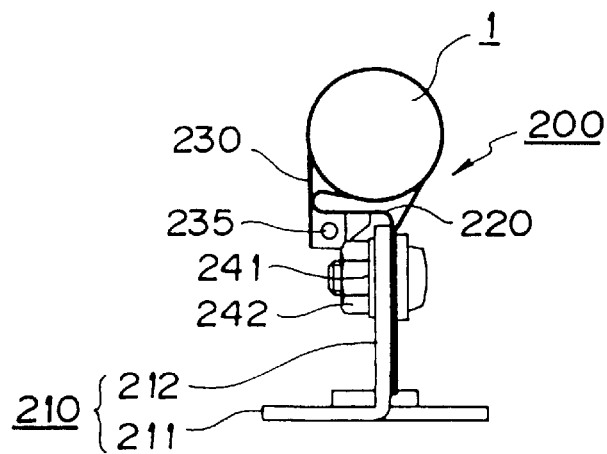
FIG. 14 is a front view showing a holder holding the camera head.
Figure 15:
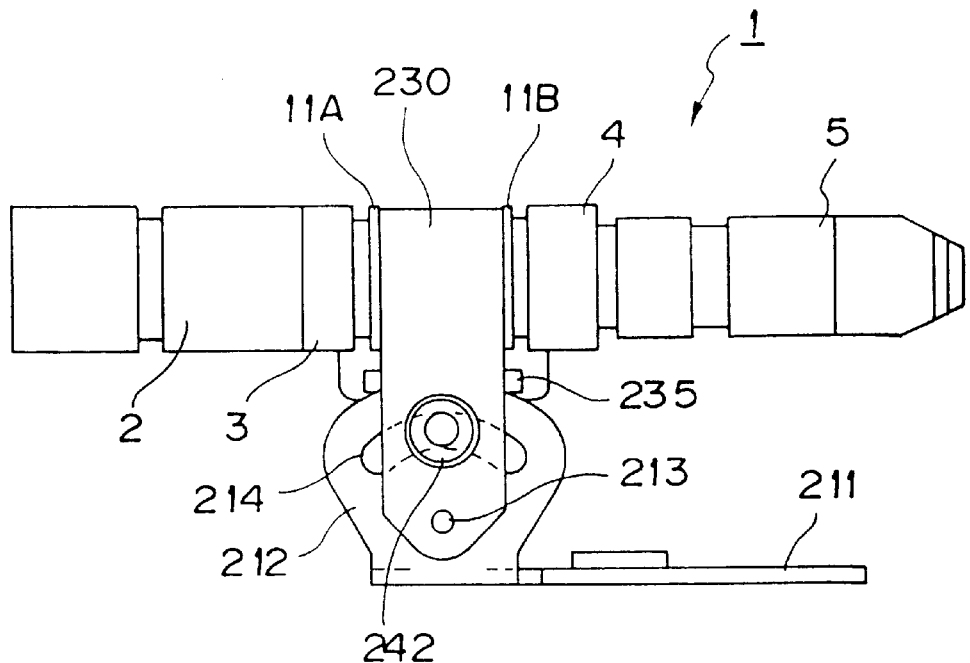
FIG. 15 is a side view showing the state in which the camera head has been mounted on the holder.
Figure 16:
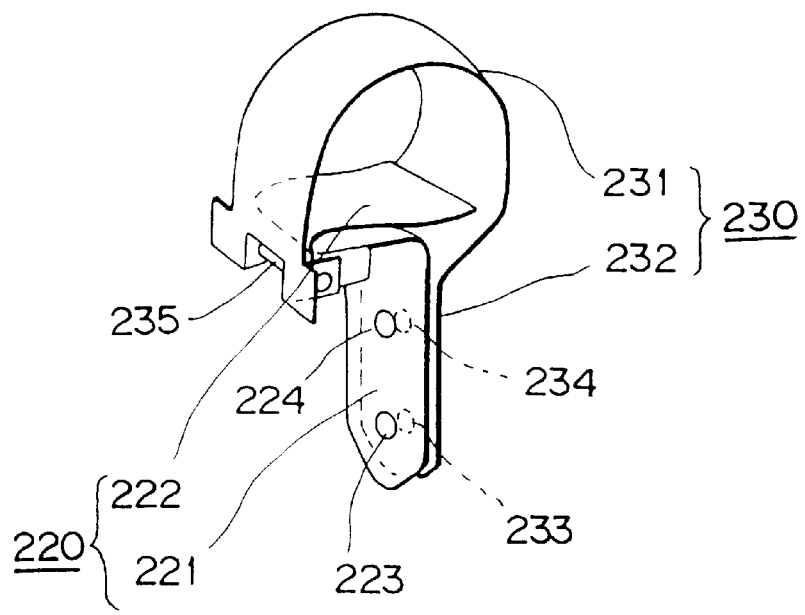
FIG. 16 is a perspective view showing first and second head grips making up the holder.

Meanwhile, the camera head 1 is loaded on a holder 200 configured as shown for example in FIGS. 14 to 16.

The holder 200 is made up of a main body of a holder 210 and first and second head grips 220, 230, as shown in FIG. 14. The first and second head grips 220, 230 are secured at a preset angle to the main body of the holder 210 by a screw 241 and a nut 242.

The main body of the holder 210 is made up of a mounting base plate 211 and a supporting plate 212 bent at a right angle from the mounting base plate 211. This supporting plate 212 is formed with a protrusion 213 by half die cutting and an arcuately-shaped elongated opening 214 lying above centered about the protrusion 13.

The first head grip 220 is formed of band-shaped stainless steel and is made up of a linear attachment portion 221 extending along the supporting plate 212 and a supporting portion 222 bent in a hair-pin shape for supporting the bottom of the camera head 1, as shown in FIG. 16. The attachment portion 221 has round holes 223, 224 in register with the protrusion 213 and the elongated opening 214, respectively, formed in the supporting plate 212.

The second head grip 230 is formed of band-shaped stainless steel and is made up of a linear attachment portion 231 extending along the supporting plate 212 and a supporting portion 232 bent in a U shape for supporting the upper portion of the camera head 1, as shown in FIG. 16. The attachment portion 231 has round holes 233, 234 in register with the protrusion 213 and the elongated opening 214, respectively, formed in the supporting plate 212.

The first and second head grips 220, 230 are connected via a hinge 235 at the proximal end of the supporting portion 222 and at the distal end of the supporting portion 232 in order to permit opening/closure of the second head grip 230.

In the above-described structure of the holder 200, the second head grip 230 is opened and the camera head 1 is placed on the supporting portion 222 of the head grip 220. The second head grip 230 is then closed for clamping the portion between the flanges 11A, 11B formed on the outer casing 10 of the camera head 1 by the supporting portions 222, 232 of the first and second head grips 220, 230. Under this condition, the round holes 223, 233 formed in the attachment portions 220, 230 of the first and second head grips 220, 230 are engaged by the protrusion 213 of the supporting plate 212 for provisionally securing the first and second head grips 220, 230. For this provisional attachment, the round hole 233 formed in the attachment portion 231 of the head grip 230 does not reach the protrusion 213 even if the protrusion 213 of the supporting plate 212 is fitted in the round hole 223 of the first head grip 220. In this state, the supporting portion 232 of the second head grip 230 is thrust downwards along with the camera head 1. This causes the hair-pin-shaped supporting portion 222 of the second head grip 220 to be elastically deformed and lowered to cause the round hole 233 in the second head grip 230 to be engaged by the protrusion 213. If, in this state, the supporting portion 232 of the second head grip 230 ceases to be lowered along with the camera head 1, the camera head 1 is clamped and constrained by the supporting portions 222, 232 of the first and second head grips 220, 230. If, in this provisionally attached state, the screw 241 is inserted into the round holes 224, 234 formed in the attachment portions 221, 231 of the head grips 220, 230 and into the elongated opening 214 formed in the attachment base plate 211 of the main body of the holder 210, and secured in position by the nut 242, the camera head 1 is loaded and secured in position.

At this time, the setting angle of the camera head 1 can be adjusted within the range of the opening 214.

Meanwhile, the two flanges 11A, 11B formed on the outer casing 10 of the camera head 1 are formed with visible marks for identifying the upper portion of the camera head for identifying the upper and lower portions of the camera head. Since there are two portions capable of inscribing these marks, these marks may also be used for identifying the type of the camera head 1. Specifically, a straight line parallel to the optical axis is used as the mark, while the type as well as the upper and lower relative portions of the camera head can be identified by inscribing the marks in different flanges 11A, 11B for the PAL system camera head and for the NTSC system camera head.

The round type connector has a plurality of connection pins that are arranged on parallel boundary lines of a band area passed through a center of a circular connection surface thereof for dividing the connection surface in two equal portions, and a plurality of connection pins that are arranged along the circumference of said connection surface. Moreover, the soldering operation for the connection pins can be carried out easily. In addition, by setting the protruding amount from the connection surface of the connection pins arranged facing one another on the boundary lines so as to be larger than that of the circumferentially arranged connection pins, the soldering operation may be improved in workability.

Moreover, with the connection device for the flexible printed circuit board according to the present invention, the connection lands of the first and second chip component mounting portions on the flexible printed circuit board, to which are soldered an even number of connection pins arranged symmetrically on parallel boundary lines of a linear boundary area of a preset width passed through the center of the main body of the connector for splitting the surface of the main body of the connector extending at right angles to its center axis into two equal portions, are of a larger size than the connection lands to which the circumferential arranged connection pins are soldered, thus facilitating the soldering operations for the connection pins. By enlarging the area of the connection lands, a larger current may be allowed to flow via the connection pins.

Thus, the present invention provides a multi-pin round connector which is small-sized and which permits facilitated soldering operations for the connection pins. In addition, the present invention provides a connection device for the flexible printed circuit board to which the connection pins of the small-sized round type connector can be soldered easily.

Thus, according to the present invention, the cylindrically-shaped camera head may be reduced in size and improved in reliability.

What is claimed is:

1. A camera head having a flexible printed circuit board housed in a cylindrical outer casing, comprising:

a first electrical component mounting portion and a second electrical component mounting portion, each being formed by a thick film interconnected by a folding portion comprised of a thin film, said first and second electrical component mounting portions being folded about said folding portion, so that flat surfaces of the first and second electrical component mounting portions carrying electrical components face outwardly, wherein said printed circuit board has substantially rectangular first and second electrical component mounting portions, first and second soldering portions connected to short sides of said first electrical component mounting portion via second and third folding portions formed by thin films, said first and second soldering portions being thick films; and third and fourth soldering portions connected to short sides of said second electrical component mounting portion via fourth and fifth folding portions formed by thin films, said third and fourth soldering portions being thick films, wherein said first to fourth soldering portions are folded at said second to fifth folding portions for soldering thereto.

2. The camera head as claimed in claim 1 wherein said first to fourth soldering portions are bent substantially 90° at said second to fifth folding portions, respectively, for soldering thereto.

3. The camera head as claimed in claim 2 further comprising:

a round type connector connected to said printed circuit board and having a plurality of connection pins arranged on concentric boundary lines of a band area passing through a center of a circular connection surface thereof and dividing the connection surface in two equal portions; and a plurality of connection pins arranged along a circumference of said connection surface.

4. The camera head as claimed in claim 3 wherein a protruding amount from the connection surface of said connection pins arranged facing one another on said boundary lines is larger than a protruding amount of the circumferentially arranged connection pins.

5. The camera head as claimed in claim 1 further comprising two flanges provided on said outer casing so that a band member for securing the camera head is not deviated from its pre-set position, wherein one of said two flanges is provided with an indication for identifying a signal system of said camera head.

6. The camera head as claimed in claim 1 further comprising two flanges provided on said outer casing so that a band member for securing the camera head is not deviated from its pre-set position, wherein one of said two flanges is provided with an indication for identifying a top side and a bottom side of said camera head and the other of the two flanges is provided with an indication for identifying a signal system of said camera head.

7. The camera head as claimed in claim 1 further comprising:

a holding member for holding an optical filter at a preset position relative to said outer casing.

8. The camera head as claimed in claim 1 further comprising:

a band member for securing the camera head to an external object.

9. A camera head having a flexible printed circuit board housed in a cylindrical outer casing, comprising:

a first electrical component mounting portion and a second electrical component mounting portion, each being formed by a thick film interconnected by a folding portion comprised of a thin film, said first and second electrical component mounting portions being folded about said folding portion, so that flat surfaces of the first and second electrical component mounting portions carrying electrical components face outwardly; and two flanges provided on said outer casing so that a band member for securing the camera head is not deviated from its pre-set position, wherein one of said two flanges is provided with an indication for identifying a top side and a bottom side of said camera head.

10. A camera head having a flexible printed circuit board housed in a cylindrical outer casing, comprising:

a first electrical component mounting portion and a second electrical component mounting portion, each being formed by a thick film interconnected by a folding portion comprised of a thin film, said first and second electrical component mounting portions being folded about said folding portion, so that flat surfaces of the first and second electrical component mounting portions carrying electrical components face outwardly; and an inner casing of a length corresponding to a length of said printed circuit board and having on one side thereof an engagement portion with a back plate of an image sensor housed within said outer casing and having on another end thereof an inner casing having an engagement portion for engaging with said round type connection, wherein said inner case is made up of two inner casing halves abutted to each other and used for position matching in a rotational direction about an optical axis of the camera head.

11. The camera head as claimed in claim 10 wherein said round type connector has a first engagement portion for engaging with said inner casing and a second engagement portion for engaging with said outer casing.

12. The camera head as claimed in claim 10 wherein said back plate is formed by molding of plastics material and includes a step portion and burrs produced during said molding of said step are formed on a surface other than an adhesive surface.

* * * * *